(12) United States Patent
Cho et al.

(10) Patent No.: US 10,453,707 B2
(45) Date of Patent: Oct. 22, 2019

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Yong Seok Cho, Seoul (KR); Hyung Joon Kim, Yongin-si (KR); Jung Ho Kim, Seongnam-si (KR); Joong Yun Ra, Hwaseong-si (KR); Bi O Kim, Seoul (KR); Jae Young Ahn, Seongnam-si (KR); Ki Yong Oh, Seoul (KR); Sung Hae Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/791,795

(22) Filed: Oct. 24, 2017

(65) Prior Publication Data

US 2018/0315621 A1    Nov. 1, 2018

(30) Foreign Application Priority Data

Apr. 28, 2017 (KR) .................. 10-2017-0054997

(51) Int. Cl.
| | |
|---|---|
| *H01L 21/00* | (2006.01) |
| *H01L 21/56* | (2006.01) |
| *H01L 21/8239* | (2006.01) |
| *H01L 21/768* | (2006.01) |
| *H01L 21/8234* | (2006.01) |

(Continued)

(52) U.S. Cl.
CPC ...... *H01L 21/565* (2013.01); *H01L 21/28088* (2013.01); *H01L 21/28282* (2013.01); *H01L 21/76831* (2013.01); *H01L 21/76877* (2013.01); *H01L 21/8239* (2013.01); *H01L 21/823437* (2013.01); *H01L 21/823475* (2013.01); *H01L 21/823481* (2013.01); *H01L 27/10876* (2013.01); *H01L 27/11582* (2013.01)

(58) Field of Classification Search
CPC ............ H01L 21/565; H01L 21/76831; H01L 21/823475
See application file for complete search history.

(56) References Cited

U.S. PATENT DOCUMENTS 8,575,680 B2 * 11/2013 Shin .................. H01L 27/11521
                                                                257/315
8,901,526 B2 * 12/2014 Nam .................... H01L 45/1253
                                                                257/1

(Continued)

FOREIGN PATENT DOCUMENTS

| JP | 05-291177 A | 11/1993 |
|---|---|---|
| JP | 2011-222600 A | 11/2011 |

*Primary Examiner* — Laura M Menz
(74) *Attorney, Agent, or Firm* — Lee & Morse, P.C.

(57) ABSTRACT

A method for fabricating a semiconductor device, the method including forming a mold structure on a substrate such that the mold structure includes alternately and repeatedly stacked interlayer insulating films and sacrificial films; forming a channel hole passing through the mold structure; forming a vertical channel structure within the channel hole; exposing a surface of the interlayer insulating films by removing the sacrificial films; forming an aluminum oxide film along a surface of the interlayer insulating films; forming a continuous film on the aluminum oxide film; and nitriding the continuous film to form a TiN film.

9 Claims, 17 Drawing Sheets

(51) Int. Cl.
    *H01L 21/28*     (2006.01)
    *H01L 27/108*     (2006.01)
    *H01L 27/11582*     (2017.01)

(56) References Cited

U.S. PATENT DOCUMENTS

| | | | |
|---|---|---|---|
| 9,041,009 | B2 | 5/2015 | Doris et al. |
| 9,093,547 | B2 * | 7/2015 | Lee ............... H01L 29/7926 |
| 9,324,727 | B2 * | 4/2016 | Lee ............... H01L 27/11582 |
| 9,397,046 | B1 | 7/2016 | Sharangpani et al. |
| 10,074,560 | B2 * | 9/2018 | Yoon ............. H01L 21/76865 |
| 2013/0099323 | A1 | 4/2013 | Zhu et al. |
| 2014/0054675 | A1 * | 2/2014 | Lee ............... H01L 29/7926 |
| | | | 257/324 |
| 2016/0225714 | A1 * | 8/2016 | Yun ............... H01L 27/11573 |
| 2016/0260813 | A1 * | 9/2016 | Cho ............... H01L 29/4236 |
| 2016/0268302 | A1 * | 9/2016 | Lee ............... H01L 27/11582 |
| 2016/0343718 | A1 * | 11/2016 | Lu ................. H01L 27/1157 |
| 2016/0358921 | A1 * | 12/2016 | Park ............... H01L 29/42376 |
| 2017/0244031 | A1 * | 8/2017 | Jeong ............. H01L 45/04 |
| 2018/0315621 | A1 * | 11/2018 | Cho ............... H01L 21/28282 |
| 2018/0374926 | A1 * | 12/2018 | Lee ............... H01L 29/4983 |
| 2019/0027582 | A1 * | 1/2019 | Lee ............... H01L 29/66621 |
| 2019/0081148 | A1 * | 3/2019 | Chung ............ H01L 29/42392 |

* cited by examiner

METHOD FOR FABRICATING SEMICONDUCTOR DEVICE

CROSS-REFERENCE TO RELATED APPLICATION

Korean Patent Application No. 10-2017-0054997, filed on Apr. 28, 2017, in the Korean Intellectual Property Office, and entitled: "Method for Fabricating Semiconductor Device," is incorporated by reference herein in its entirety.

BACKGROUND

1. Field

Embodiments relate to a method for fabricating a semiconductor device.

2. Description of the Related Art

A semiconductor memory device is a memory device implemented by using a semiconductor such as silicon (Si), germanium (Ge), gallium arsenide (GaAs), indium phosphide (InP), or the like. The semiconductor memory device is roughly divided into a volatile memory device and a nonvolatile memory device. The volatile memory device is a memory device in which stored data becomes extinct when power supply is cut. The volatile memory device includes a static RAM (SRAM), a dynamic RAM (DRAM), a synchronous DRAM (SDRAM), or the like. The nonvolatile memory device is a memory device which keeps stored data even when power supply is cut. The nonvolatile memory device includes a flash memory device, a read only memory (ROM), a programmable ROM (PROM), an electrically programmable ROM (EPROM), an electrically erasable and programmable ROM (EEPROM), a resistive memory device (e.g., phase-change RAM (PRAM), ferroelectric RAM (FRAM), resistive RAM (RRAM)), or the like.

SUMMARY

The embodiments may be realized by providing a method for fabricating a semiconductor device, the method including forming a mold structure on a substrate such that the mold structure includes alternately and repeatedly stacked interlayer insulating films and sacrificial films; forming a channel hole passing through the mold structure; forming a vertical channel structure within the channel hole; exposing a surface of the interlayer insulating films by removing the sacrificial films; forming an aluminum oxide film along a surface of the interlayer insulating films; forming a Ti-containing continuous film on the aluminum oxide film; and nitriding the continuous film to form a TiN film.

The embodiments may be realized by providing a method for fabricating a semiconductor device, the method including depositing an AlO film; forming a continuous film on the AlO film, wherein a thickness of the continuous film is greater than 0 angstrom to 20 angstroms; nitriding the continuous film to form a TiN film; and forming a metal film comprising tungsten on the TiN film.

The embodiments may be realized by providing a method for fabricating a semiconductor device, the method including forming a trench by etching a substrate; forming an AlO film along an inner wall of the trench; forming a continuous film along an upper surface of the AlO film such that a thickness of the continuous film is greater than 0 angstroms to 20 angstroms; nitriding the continuous film to form a TiN film; and forming a metal film on the TiN film.

BRIEF DESCRIPTION OF THE DRAWINGS

Features will be apparent to those of skill in the art by describing in detail exemplary embodiments with reference to the attached drawings in which.

DETAILED DESCRIPTION

In the following description, a method for fabricating a semiconductor device according to some exemplary embodiments will be described by referring to FIGS. 1 to 12.

FIGS. 1 to 12 illustrate views of stages in a method for fabricating a semiconductor device according to some exemplary embodiments.

Figure 1:
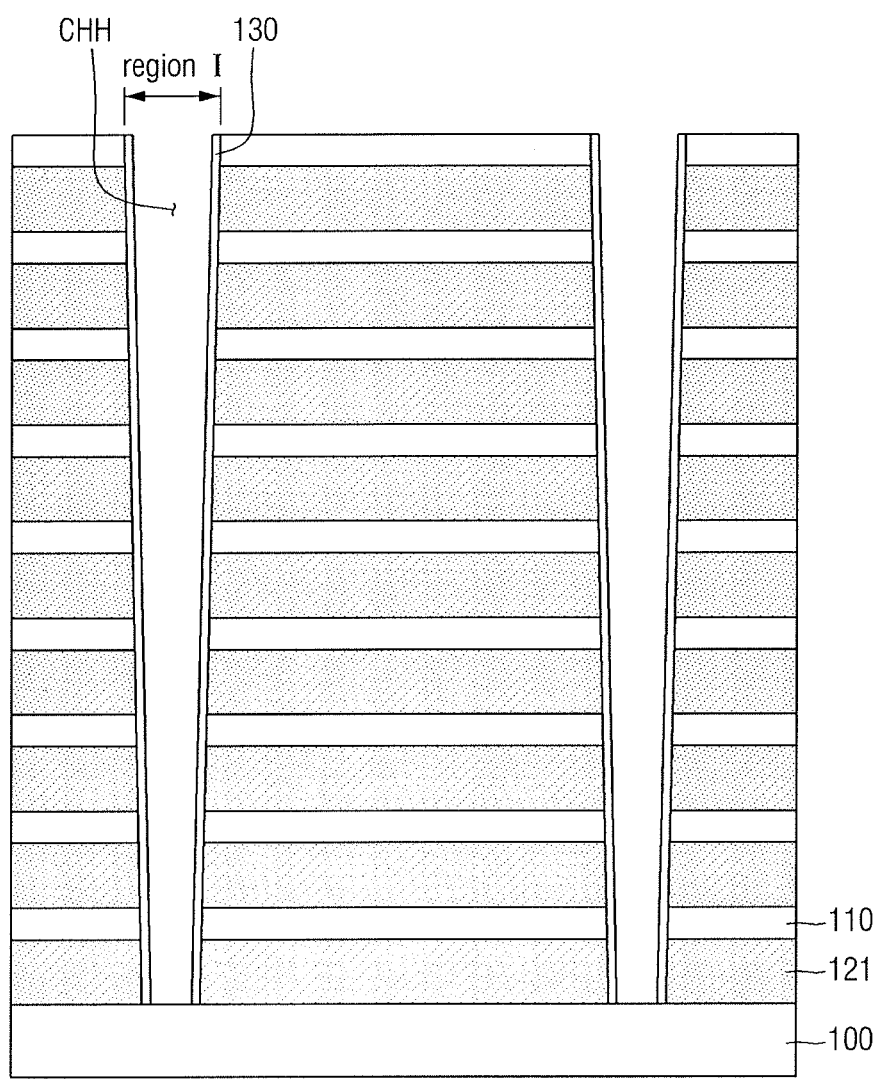
FIGS. 1 to 12 illustrate views of stages in a method for fabricating a semiconductor device according to some exemplary embodiments.

First, referring to FIG. 1, a mold structure may be formed on a first substrate 100.

The first substrate 100 may be, e.g., a bulk silicon or a silicon-on-insulator. In an implementation, the first substrate 100 may be a first silicon substrate, or may include other materials such as silicon germanium, indium antimonide, lead telluride compound, indium arsenide, indium phosphide, gallium arsenide, or gallium antimonide. In an implementation, the first substrate 100 may have an epitaxial layer formed on a base substrate.

A sacrificial film 121 and a first interlayer insulating film 110 may be alternately stacked on the first substrate 100. For example, a plurality of sacrificial films 121 and a plurality of first interlayer insulating films 110 may be sequentially stacked, which may form a vertical mold structure.

In this example, the sacrificial film 121 and the first interlayer insulating film 110 may include different materials from each other. In this example, by the different materials, it may mean the materials that have different etch selectivities to a specific etchant or etching gas. Accordingly, when an etch process is performed with the specific etchant or etching gas, only the sacrificial film 121 may be removed and the first interlayer insulating film 110 may remain.

In an implementation, the sacrificial film 121 may be, e.g., a silicon nitride film, and the first interlayer insulating film 110 may be, e.g., a silicon oxide film. In an implementation, the sacrificial film 121 and the first interlayer insulating film 110 may include materials that allow the sacrificial film 121 and the first interlayer insulating film 110 to respectively have etch selectivities with respect to one another.

In an implementation, the first interlayer insulating film 110 may include a low-k dielectric material. By the low-k dielectric material, it may mean a material having a lower dielectric constant than silicon oxide.

A channel hole CHH may be formed within or through a plurality of sacrificial films 121 and a plurality of first interlayer insulating films 110 which are alternately stacked on the first substrate 100. For example, the channel hole CHH may pass through a plurality of sacrificial films 121 and a plurality of first interlayer insulating films 110. With formation of the channel hole CHH, an upper surface of the first substrate 100 may be exposed, e.g., instead of being overlain by the mold structure.

For example, the channel hole CHH may be formed by etching a first region (region I) of the plurality of first interlayer insulating films 110 and a first region (region I) of the plurality of sacrificial films 121. The region I of the plurality of first interlayer insulating films 110 and the region I of the plurality of sacrificial films 121 may be regions at positions overlapping in a vertical direction.

For example, a plurality of channel holes CHH may be formed to be spaced apart from one another in a horizontal direction. In an implementation, as illustrated in FIG. 1, e.g., the device may include two channel holes CHH spaced apart in the horizontal direction.

With formation of the channel hole CHH, side surfaces in a horizontal direction of a plurality of first interlayer insulating films 110 and a plurality of sacrificial films 121 (e.g., an interior surface of the channel hole CHH) may also be exposed.

The channel hole CHH may be formed, e.g., in a manner of using a hard mask. For example, a hard mask that exposes only a shape of the channel hole CHH may be formed on the first interlayer insulating film and the channel hole CHH may be formed by sequentially etching the exposed portions with dry etching. Accordingly, sidewalls of the channel hole CHH may have a profile that is substantially vertical. Alternatively, as illustrated in FIG. 1, the sidewalls of the channel hole CHH may be in a tapered shape. The tapered shape may be generated as an etch rate of the mold structure in a vertical direction becomes weaker as more away from the exposed portion.

In an implementation, a position of the channel hole CHH may not be aligned in a, e.g., single, horizontal direction. For example, a plurality of channel holes CHH may be disposed in a zig-zag way and spaced apart from each other.

An insulating layer 130 may be formed on the sidewalls of each channel hole CHH. In an implementation, the insulating layer 130 may be formed along an upper surface of an uppermost layer of the first interlayer insulating layer 130, and along sidewalls and bottom surfaces of the channel hole CHH. Thereafter, an etch-back process may substantially remove the upper surface of the uppermost first interlayer insulating layer 130 and portions of the insulating layer 130 formed on the upper surface of the first substrate 100. Accordingly, the insulating layer 130 having a straw shape that exposes the upper surface of the first substrate 100 may be formed on the sidewall of each channel hole CHH. For example, the insulating layer 130 may have a shape of a cylinder of which an interior is passed through.

In an implementation, the insulating layer 130 may include, e.g., a blocking insulating layer 131, a charge trap layer 132, and a tunnel insulating layer 133. This will be explained in detail below.

In an implementation, the plurality of films forming the insulating layer 130 may each be formed through, e.g., a chemical vapor deposition (CVD) process, a plasma enhanced chemical vapor deposition (PECVD) process, an atomic layer deposition (ALD) process, or the like.

Figure 2:
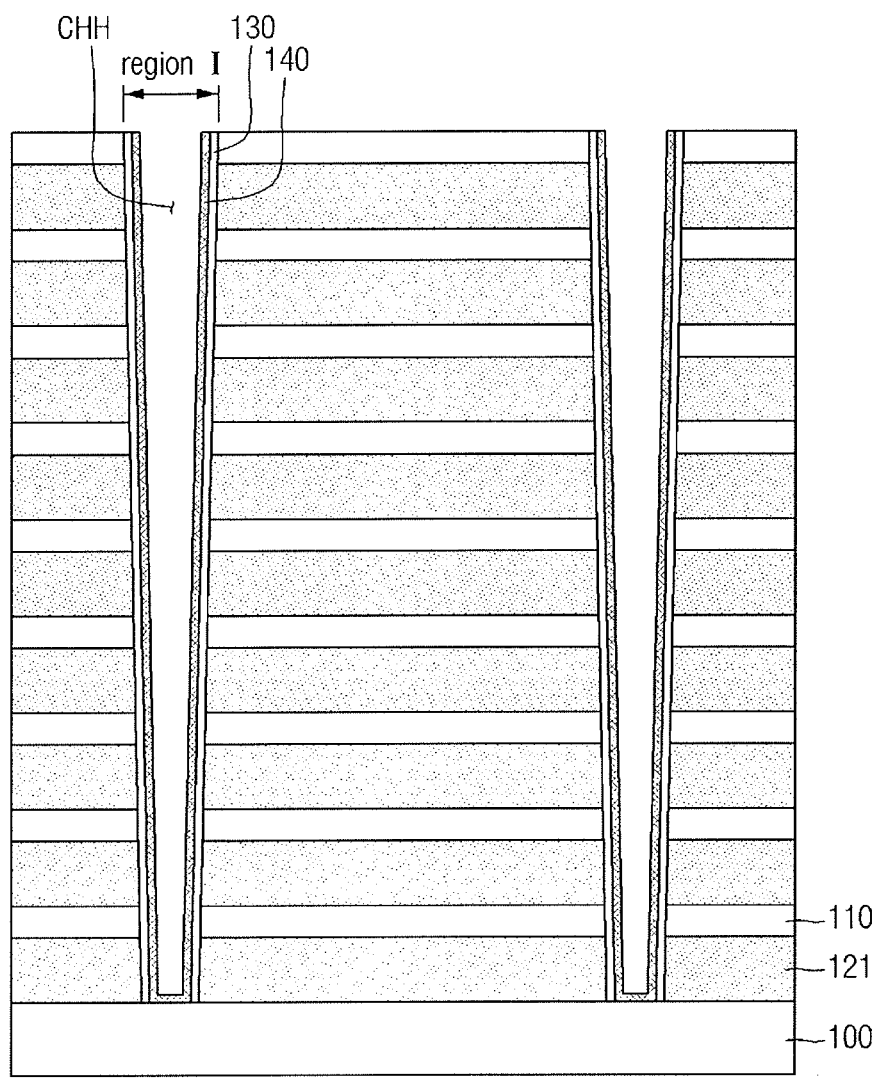

Next, referring to FIG. 2, a channel layer 140 may be formed within the channel hole CHH.

The channel layer 140 may be formed along an upper or inwardly facing surface of the insulating layer 130. The channel layer 140 may also be formed along an upper surface of the first substrate 100 exposed by or in the channel hole CHH. For example, the channel layer 140 may have a shape of a cup that overlies sidewalls and a bottom surface of the channel hole CHH.

In an implementation, the channel layer 140 may be formed by using polysilicon or amorphous silicon selectively doped with impurity. After the channel layer 140 is formed by using polysilicon or amorphous silicon, it may be transformed into a single crystal silicon with annealing or laser beam radiation. In this case, performance of the semiconductor device may be improved because defects within the channel layer 140 may be removed.

As the channel layer 140 is a thin film, the channel hole CHH may yet to be completely filled. Accordingly, there may be an empty space still present within the channel hole CHH.

Figure 3:
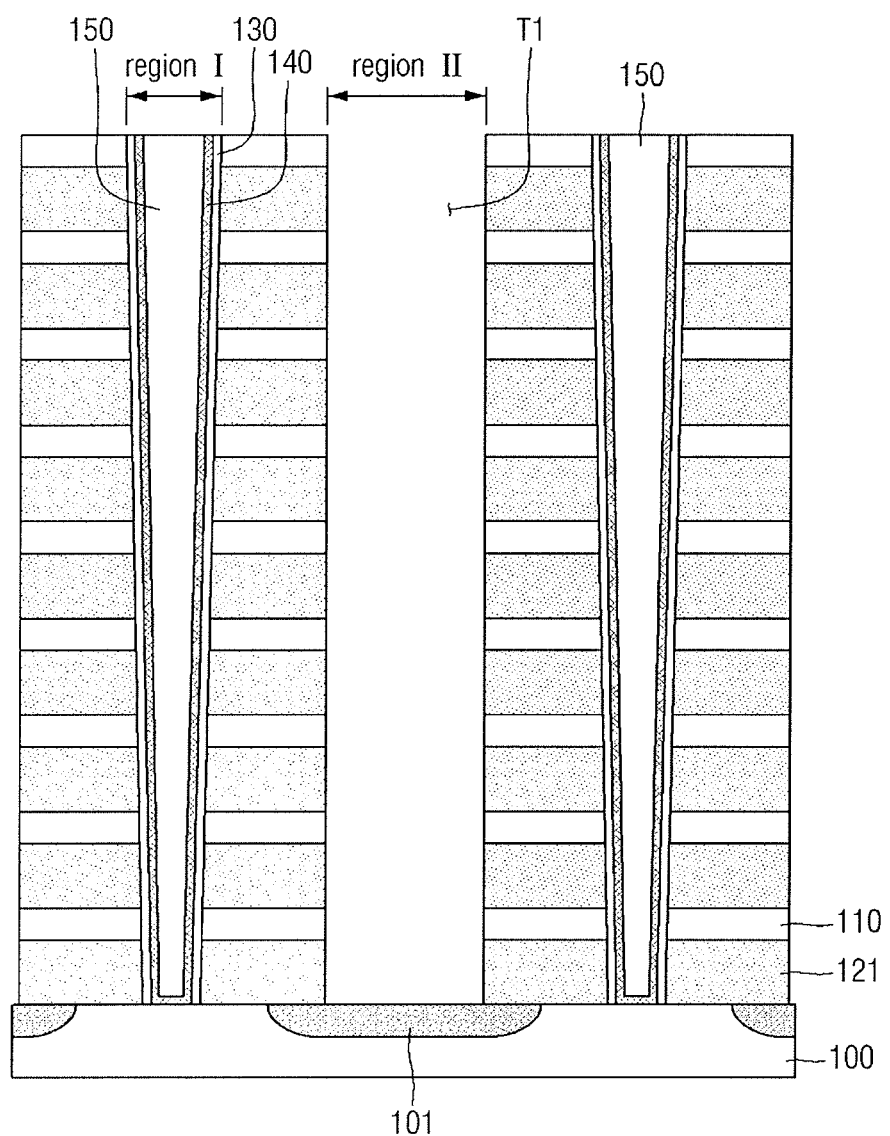

Next, referring to FIG. 3, a core layer 150 may be formed.

The core layer 150 may completely fill (e.g., remaining portions of) the channel hole CHH. For example, an outer surface of the core layer 150 may be surrounded by the channel layer 140 and the insulating layer 130 described above (e.g., and may contact the channel layer 140).

In an implementation, the core layer 150 may be formed by using an insulating material, e.g., silicon oxide. In an implementation, the channel layer 140 and the core layer 150 may each be formed through, e.g., any one of the CVD process, the PECVD process, and the ALD process.

The core layer 150, the channel layer 140, and the insulating layer 130 may construct or form a vertical channel structure when completed. The vertical channel structure may be pass through the mold structure, which includes the channel hole CHH, and in which the sacrificial film 121 and the first interlayer insulating film 110 are alternately stacked.

Next, a trench T1 may be formed within the mold structure of the plurality of sacrificial films 121 and the plurality of first interlayer insulating films 110. For example, the trench T1 may be formed by etching a second region (region II) of the plurality of first interlayer insulating films 110 and a second region (region II) of the plurality of sacrificial films 121. Region II of the plurality of first interlayer insulating films 110 and region II of the plurality of sacrificial films 121 may be positioned to completely overlap each other (e.g., be aligned) in the vertical direction. The trench T1 may be spaced apart from the vertical channel structure. For example, the trench T1 may be spaced apart from the core layer 150, the channel layer 140, and the insulating layer 130 in the horizontal direction.

The trench T1 may expose an upper surface of the first substrate 100. The trench T1 may also expose side surfaces of the plurality of first interlayer insulating films 110 and the plurality of sacrificial films 121. The trench T1 may be formed so as to extend in a certain horizontal direction, unlike the channel hole CHH.

In an implementation, the trench T1 may be formed using a hard mask which partially exposes the uppermost first interlayer insulating film 110. The hard mask may be used as an etch mask for dry etching. Accordingly, the first interlayer insulating film 110 and the sacrificial film 121 may be etched and the trench T1 may be formed. The hard mask may be formed, e.g., by using a photoresist material or a spin on hardmask (SOH) material. In an implementation, the hard mask may be removed through processes of ashing and/or stripping after the trench T1 is formed.

A common source region 101 may be formed at a portion of the first substrate 100 that is exposed by the trench T1. The common source region 101 may be formed, e.g., by using a doping process. The common source region 101 may be formed within the first substrate 100.

The common source region 101 may extend in a same direction in which the trench T1 extends, to be used as a common source line (CSL). In an implementation, a metal silicide pattern, e.g., nickel silicide pattern or cobalt silicide pattern, may be further formed on the common source region 101. Accordingly, resistance between the common source region 101 and, for example, CSL contact may be reduced.

As illustrated in FIG. 3, the trench T1 may isolate the mold structures consisting of the plurality of sacrificial films 121 and the plurality of first interlayer insulating films 110 from each other. In an implementation, as illustrated in FIG. 3, the device may include two isolated structures. In an implementation, a number of the trenches T1 may be two or more. Further, the common source region 101 may be formed as many as a number of the trenches T1. Based on the above consideration, FIG. 3 illustrates that a plurality of common source regions 101 are formed.

Figure 4:
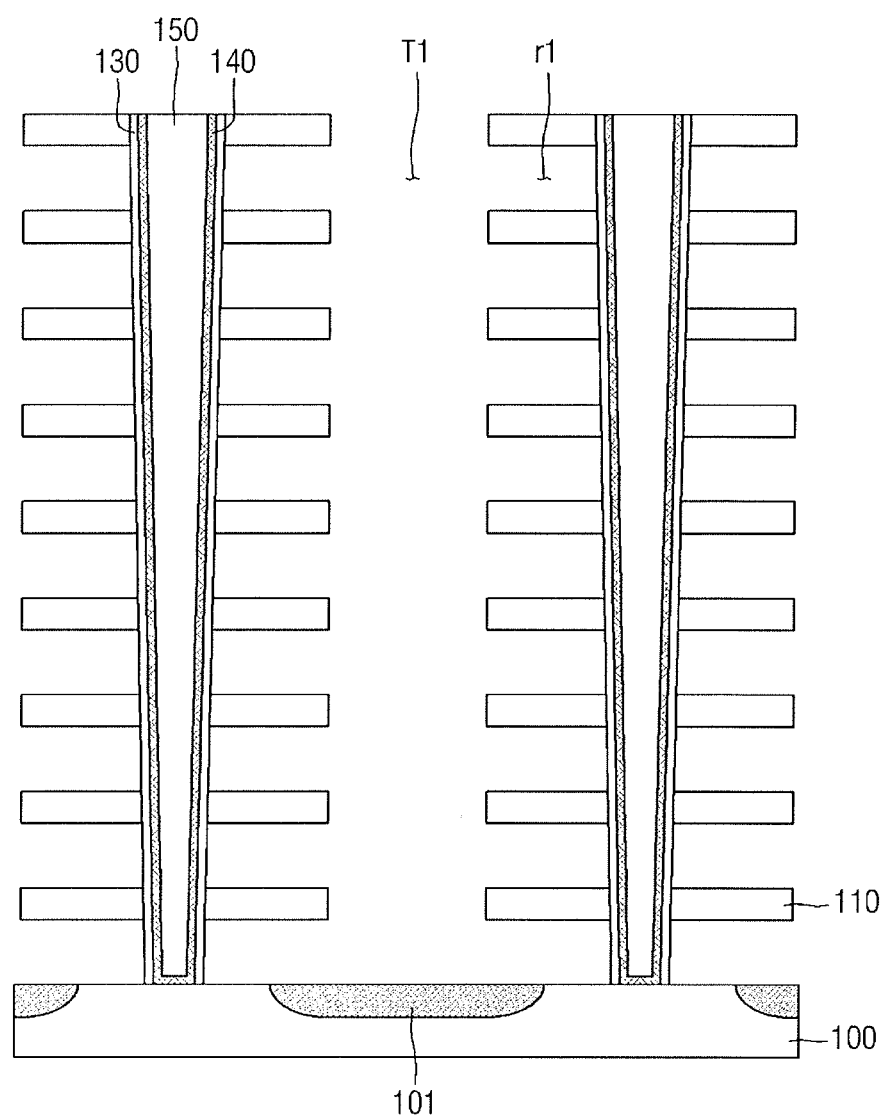

Next, referring to FIG. 4, a recess r1 may be formed by removing the sacrificial film 121 exposed by the trench T1. The recess r1 may expose a portion of the insulating layer 130 in some exemplary embodiments. The recess r1 may be formed by selectively removing the sacrificial film 121. The recess r1 may be formed, e.g., by using etchant or etching gas having a high etch selectivity of the sacrificial film 121 with respect to the first interlayer insulating film 110. For example, the etchant or etching gas may etch the sacrificial film 121 and may not or only minimally etch the first interlayer insulating film 110.

The vertical channel structure, i.e., the structure of the core layer 150, the channel layer 140, and the insulating layer 130 may be formed to have a circular or annular structure from a perspective of a plane (e.g., in plan view), and the first interlayer insulating film 110 may be formed into a structure that is passed by the vertical channel structure and spaced apart vertically. For example, the first interlayer insulating film 110 may be supported in a structure in which the first interlayer insulating film 110 is spaced apart in a vertical direction by the vertical channel structure.

In an implementation, one vertical channel structure may be included, or a plurality of vertical channel structures aligned in a horizontal direction may divide and support the structure of the first interlayer insulating film 110.

Figure 5:
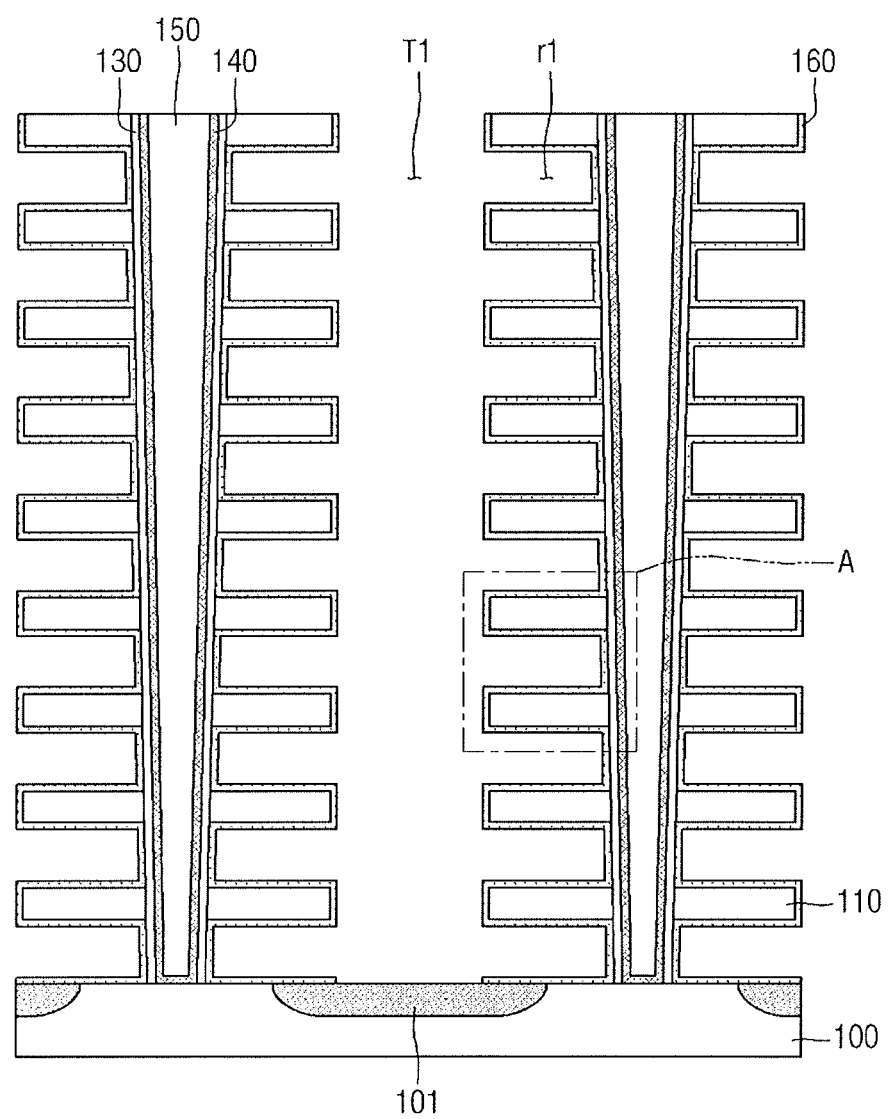

Next, referring to FIG. 5, an oxide film 160 may be formed.

The oxide film 160 may be formed along an upper surface, a bottom surface, and a side surface of the first interlayer insulating film 110. As illustrated, the oxide film 160 may be formed along a side surface of the vertical channel structure. For example, the oxide film 160 may be formed along a side surface of the insulating layer 130.

In an implementation, the oxide film 160 may expose a portion of the common source region 101 and overlie the other portions.

Figure 6:
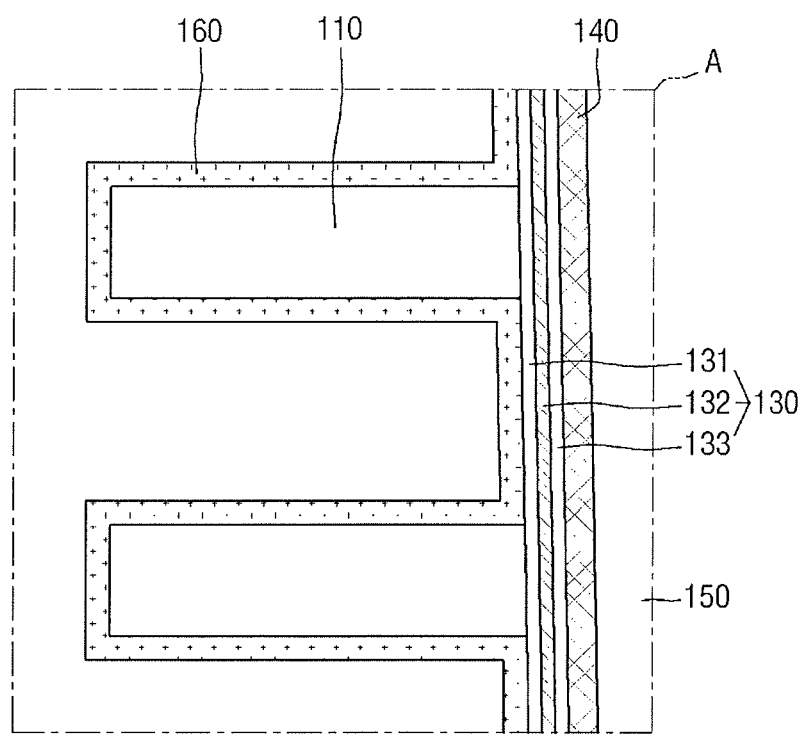

FIG. 6 illustrates an enlarged view of an encircled section A of FIG. 5.

Referring to FIG. 6, the insulating layer 130 may include, e.g., a tunnel insulating layer 133, a charge trap layer 132, and a blocking insulating layer 131, as described above.

The tunnel insulating layer 133 may be a portion where charges pass through between the channel layer 140 and the charge trap layer 132. For example, the tunnel insulating layer 133 may be a silicon oxide film or a double-layered film of a silicon oxide film and a silicon nitride film.

The charge trap layer 132 may be positioned between the tunnel insulating layer 133 and the blocking insulating layer 131. The charge trap layer 132 may be a portion where charges passing through the tunnel insulating layer 133 are stored. For example, the charge trap layer 132 may be a nitride film or a high-k dielectric film. The nitride film may include, e.g., one or more of silicon nitride, silicon oxynitride, hafnium oxynitride, zirconium oxynitride, hafnium silicon oxynitride or hafnium aluminum oxynitride.

The high-k dielectric film may include, e.g., one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The blocking insulating layer 131 may include an insulating material having a higher dielectric constant than the tunnel insulating layer 133. The blocking insulating layer 131 may be formed by using, e.g., an oxide such as silicon oxide.

Accordingly, the insulating layer 130 may have a oxide-nitride-oxide (ONO) structure in which oxide film-nitride film-oxide film are sequentially stacked. The tunnel insulating layer 133 and the charge trap layer 132 and the blocking insulating layer 131 may each be formed through the CVD process, the PECVD process, the ALD process.

The oxide film 160 may be fainted along a surface of the blocking insulating layer 131 and the first interlayer insulating film 110. The oxide film 160 may include an aluminum oxide film. For example, the oxide film 160 may be the AlO film.

Figure 7:
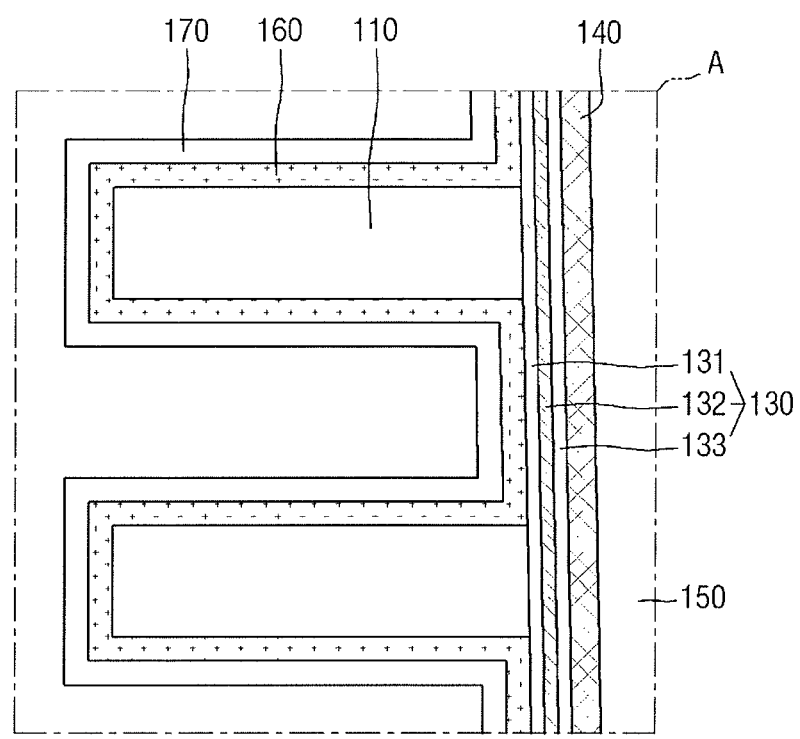

Next, referring to FIG. 7, a continuous film 170 may be formed.

The continuous film 170, e.g., Ti-containing continuous film, may be formed along an upper surface of the oxide film 160. The continuous film 170 may be continuously or conformally formed along an upper surface of the oxide film 160. The expressions "continuous" or "continuously" used herein may include both a meaning opposite the expressions "discontinuous" or "discontinuously" that represents it when a portion is cut in the middle or broken, and so on, and a meaning indicating that a thickness is regular in a direction of extension. For example, the continuous film 170 may seamlessly overlie an upper surface of the oxide film 160 with a regular thickness.

The continuous film 170 may have a very thin thickness. In an implementation, the continuous film 170 may have a thickness of, e.g., 0 angstrom to 20 angstrom. In an implementation, the thickness of the continuous film 170 may be greater than 0 angstrom. The thickness of the continuous film 170 may serve as a factor in determining a thickness of a conductive film 180 of FIG. 8 which will be transformed from the continuous film 170 later.

Additional details regarding the thickness of the continuous film 170 will be specifically explained hereinbelow.

The continuous film 170 may include TiON. In this example, an amount by weight of O, i.e., oxygen, may be greater than an amount by weight of N, i.e., nitrogen. For example, based on a total weight of O combined with N as 100, the amount of N may be 0 to 40. For example, an amount of nitrogen in the continuous film 170 may be 0 parts by weight to 40 parts by weight, based on 100 parts by weight of oxygen and nitrogen in the continuous film. In this example, the ratio of N may possibly be 0, and this may indicate that the layer is formed of TiO, instead of TiON.

Figure 8:
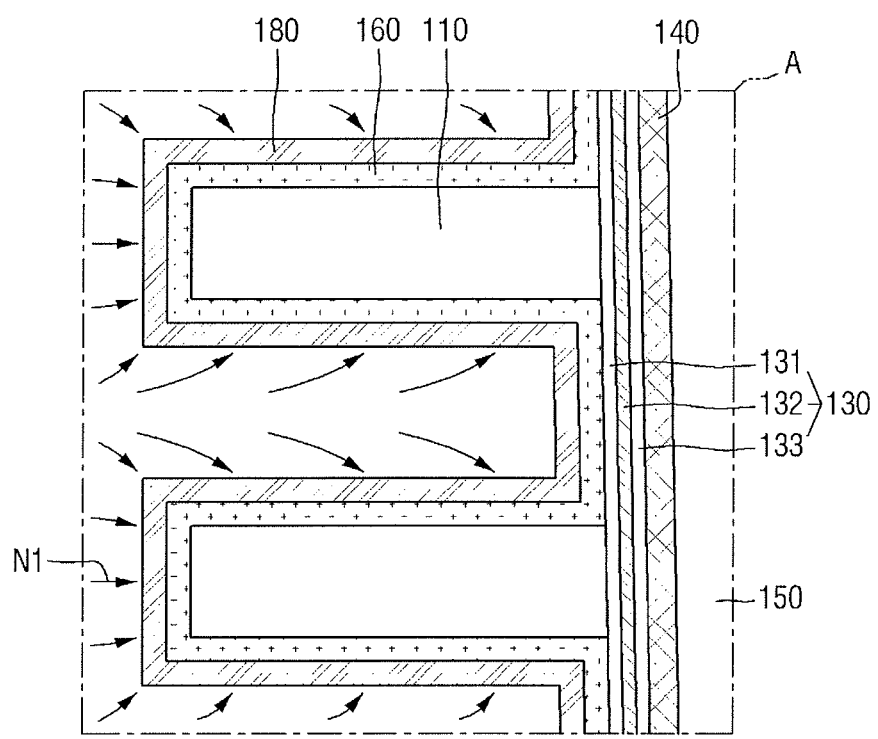

Next, referring to FIG. 8, the conductive film 180 may be formed.

The conductive film 180 may be formed by performing a first nitrating or nitriding process (N1) on the continuous film 170. For example, adding a nitrogen component to the continuous film 170 may result in transformation from the continuous film 170 into the conductive film 180. A thickness of the conductive film 180 may depend on a thickness of the continuous film 170. The expression "depend on" as used herein indicates that a thickness of the conductive film 180 may be determined according to a thickness of the continuous film 170. For example, the above expression indicates that, when the thickness of the conductive film 180 is equal to a thickness of the continuous film 170 or modified from a thickness of the existing continuous film 170, the thickness of the conductive film 180 may be minutely added or reduced based on the thickness described above.

The first nitriding process (N1) may include at least one of various processes for adding nitrogen. In an implementation, the first nitriding process (N1) may include, e.g., at least one of $NH_3$ annealing, $N_2$ plasma processing, and rapid thermal nitridation (RTN).

As a result, the conductive film 180 may include TiN. In this example, the previous TiON or TiO film (e.g., the continuous film 170) may become a TiN film (e.g., the conductive film 180), and some of oxygen may remain. For example, based on a total weight of oxygen (O) combined with nitrogen (N) as 100 in the conductive film 180, a ratio of N may be 40 to 100. For example, when a ratio of N is 100, this may mean that the TiN film may not include oxygen. In an implementation, an amount of nitrogen in the conductive film 180 may be greater than an amount of nitrogen in the continuous film 170.

Some methods may include depositing TiN itself and therefore, may not use a two-stage method for nitriding TiO or TiON. However, because a decreased thickness of a material film to be deposited may be desirable, e.g., with a miniaturization and integration of the semiconductor device, a failure to deposit a material film that is 20 angstroms or less could occur (e.g., directly depositing a TiN layer would form a layer that has a thickness of greater than 20 angstroms).

For example, if TiN were to be directly deposited, a discontinuous film instead of a continuous film could be formed. For example, the TiN film may be formed in an island shape or arrangement spaced apart from each other on an upper surface of the oxide film 160. Such discontinuous TiN film may not completely overlie the oxide film 160, nor it may have a regular thickness, and may thus generate several problems in later processes.

Accordingly, in order to form a final, continuous, and regular TiN film, the method for fabricating the semiconductor device according to an exemplary embodiment may form a TiO or TiON film and perform a nitridation to thus form a final, thin and continuous TiN or TiON film.

Figure 9:
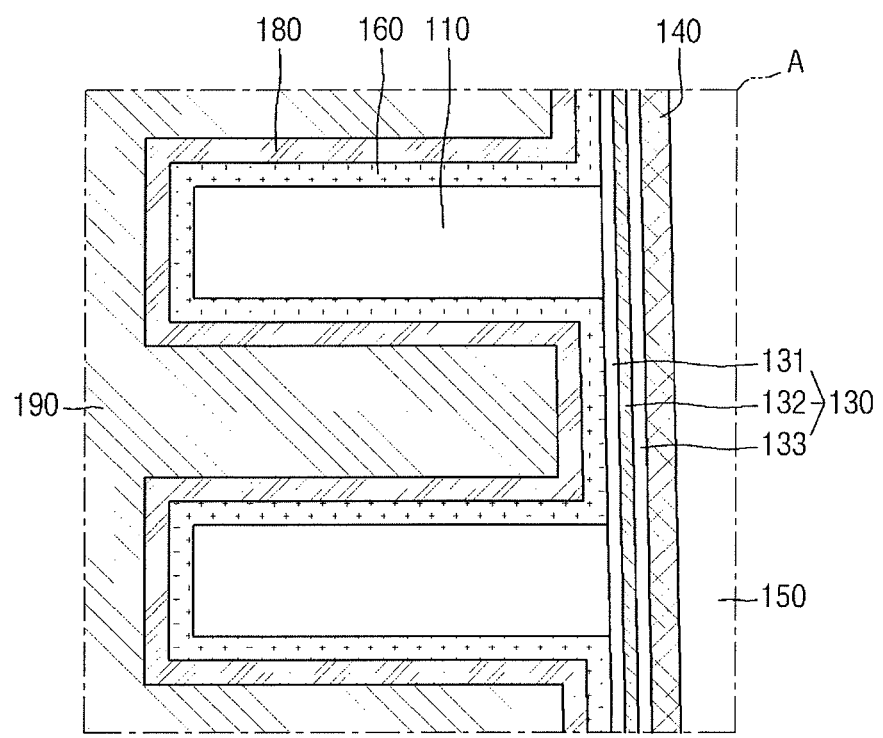

Next, referring to FIG. 9, a metal film 190 may be formed.

The metal film 190 may be formed to completely fill the recess r1 on the conductive film 180. In an implementation, the metal film 190 may overlie an upper portion of the conductive film 180 formed beyond the recess r1. The metal film 190 in conjunction with the conductive film 180 may serve as a word line or a gate electrode.

The metal film 190 may include, e.g., tungsten (W). For example, the metal film 190 may be formed by depositing tungsten. For example, $WF_6$ may be used as a precursor. In an implementation, a F (fluorine) component may partially remain within the metal film 190.

If the continuous film 170 or the conductive film 180 were to be formed to be relatively thicker or irregular, a vertical gap between the first interlayer insulating films 110 could be reduced as much as the thickness. In such a case, the metal film 190 may not be formed regularly according to step coverage.

If the metal film 190 were to not grow regularly, a vertical surface of the first interlayer insulating film 110, i.e., a lower surface of the first interlayer insulating film 110 positioned above and a surface of the metal film 190 growing from the upper surface of the first interlayer insulating film 110 positioned below may not meet naturally, and could form a silt therewithin.

Such a slit may become a space where the two surfaces exceed a junction surface where the two surfaces meet, thus preventing contact of the two surfaces. If the slit were to be formed with a certain volume or larger, F (fluorine), which is remaining within the metal film 190 after being used in the precursor of the metal film 190, could be left in the slit in a form of $F_2$.

Hydrogen (H) in gas form, which may remain within the first interlayer insulating film 110, may meet $F_2$ mentioned above, thus forming HF. HF thus formed could be diffused beyond the oxide film 160 into the blocking insulating layer 131 of the insulating layer 130. The diffused HF could damage the semiconductor device by melting the oxide film 160, the first interlayer insulating film 110 and the blocking insulating layer 131.

The method for fabricating the semiconductor device according to some exemplary embodiments may help reduce and/or prevent the damage of the blocking insulating layer 131 described above by forming a very thin conductive film 180 which is continuous and regular.

Figure 10:
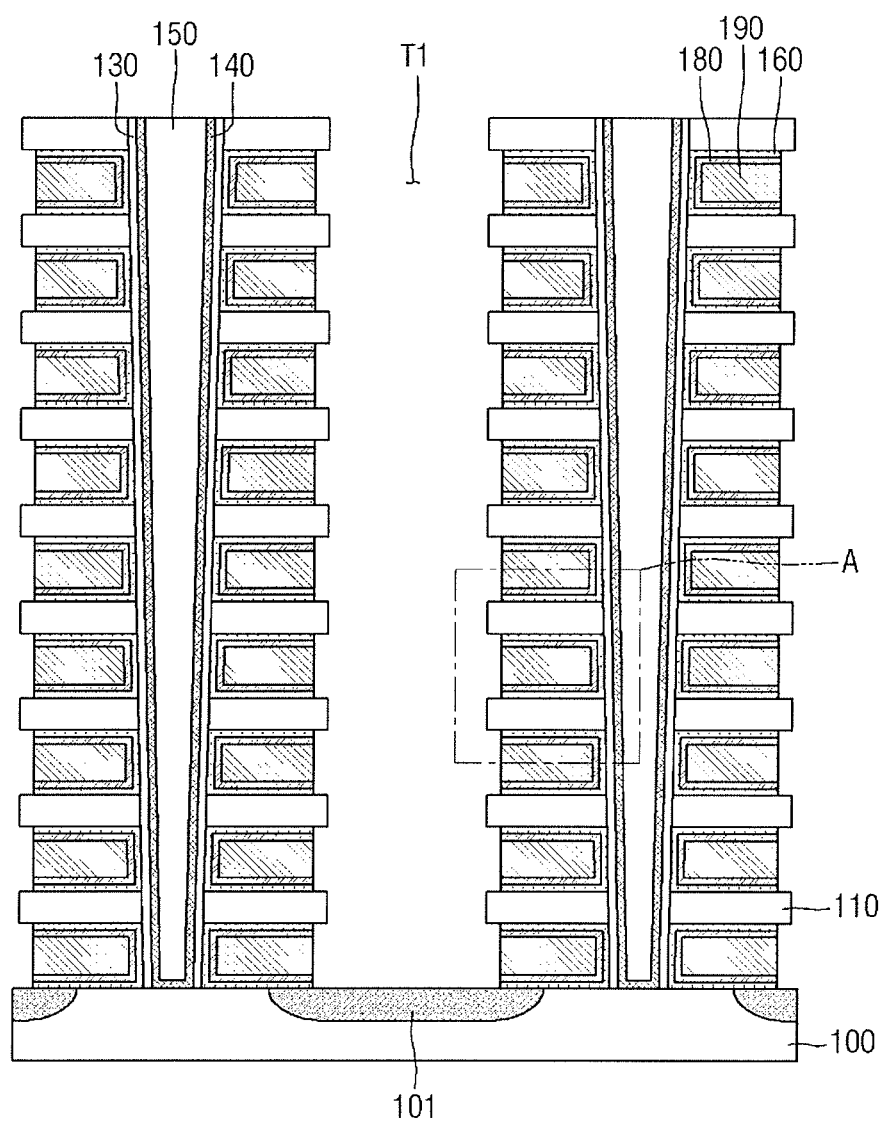
Figure 11:
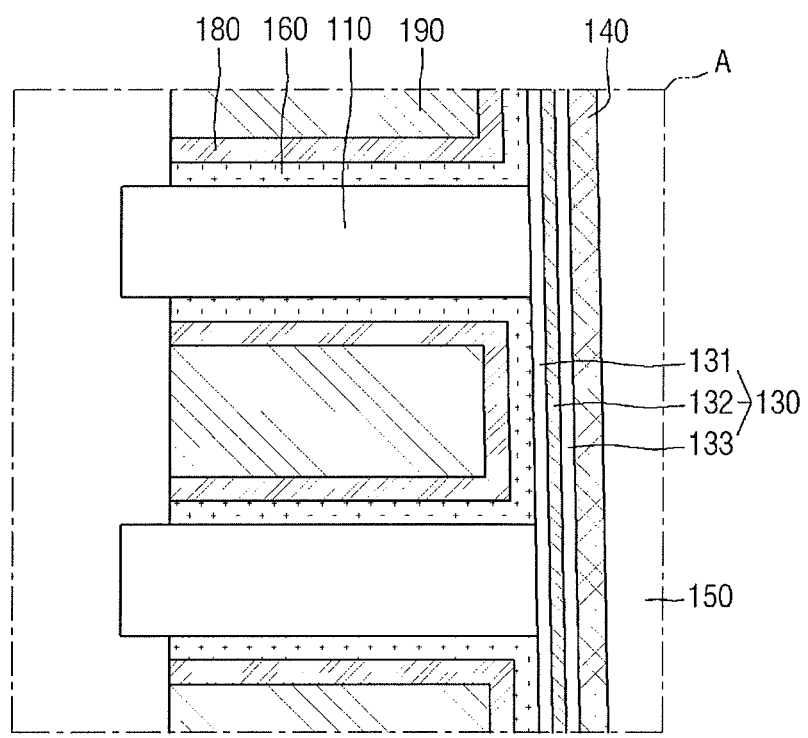

Next, referring to FIGS. 10 and 11, the metal film 190, the conductive film 180 and the oxide film 160 may be etched, thus isolating elements.

For example, a distance from an end of the first interlayer insulating film 110 to the channel hole CHH may be greater than a distance from an end of the metal film 190, the conductive film 180 and the oxide film 160 to the channel hole CHH. As a result, each element may be isolated into a plurality of elements.

If the conductive film 180 were to be irregular and discontinuous, etching of the metal film 190 could also be performed irregularly. For example, the oxide film 160 may be formed thinner than in the related device, and if a subsequent TiN film, i.e., if the conductive film 180 were to deposited irregularly, a portion of the conductive film 180 that is formed relatively thinner could be etched excessively in the etch process, and accordingly, a portion of the metal film 190 adjacent to the etched conductive film 180 could be torn out.

If such an occurrence were to happen, features of gate electrodes of a plurality of isolated elements, i.e., the metal film 190, may not be defined constantly so that regularity between the elements may not be ensured, and reliability of the entire semiconductor device could be severely damaged.

In an implementation, the method for fabricating the semiconductor device according to some exemplary embodiments may form the regular conductive film 180 while maintaining very thin thickness, the metal film 190 may be etched regularly, and the features of the isolated elements may be formed regularly, and accordingly, features of the entire semiconductor device may be enhanced.

Figure 12:
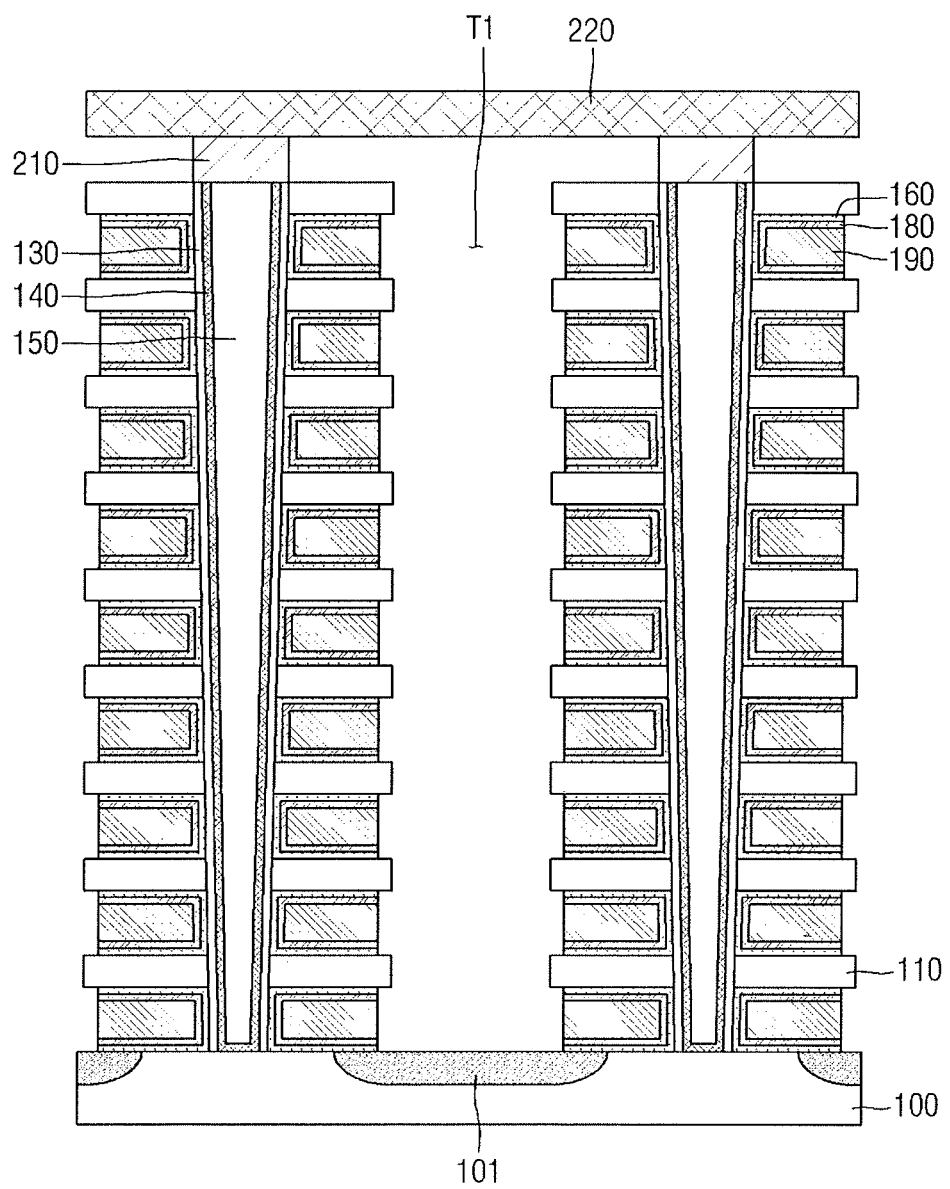

Next, referring to FIG. 12, a drain 210 and a first bit line 220 may be formed.

The drain 210 may be formed on the vertical channel structure, i.e., may be formed on the core layer 150, the channel layer 140 and the insulating layer 130. The drain 210 may include a conductor. The drain 210 may be electrically connected with the vertical channel structure and the first bit line 220.

There may be one first bit line 220 connecting the two mold structures which are formed on the drain 210 and isolated from each other. From a perspective of plane or in plan view, the first bit line 220 may form a shape of an array while intersecting with the metal film 190 in a lattice pattern.

The method for fabricating the semiconductor device according to some exemplary embodiments may help prevent the blocking insulating layer 131 from melting down and prevent the metal film 190 from being torn out, through deposition of a conductive film 180 that is regular and thin in a nonvolatile memory device, as described above. As a result, the method may provide a semiconductor device having high integration, and also high stability and regularity.

Hereinbelow, a method for fabricating a semiconductor device according to some exemplary embodiments will be described with reference to FIGS. 13 to 20. In the following description, repeated description overlapping with the exemplary embodiments already provided above may not be described or described as brief as possible for the sake of brevity.

Figure 13:
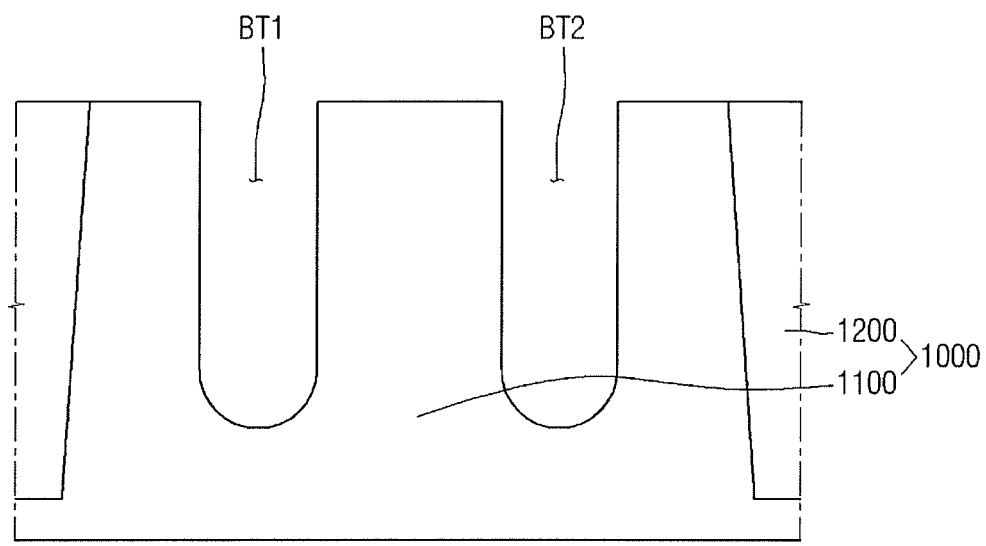
FIGS. 13 to 20 illustrate views of stages in a method for fabricating a semiconductor device according to some exemplary embodiments.

Next, referring to FIG. 13, a first buried trench BT1 and a second buried trench BT2 may be formed in a second substrate 1000.

The second substrate 1000 may be, e.g., a bulk silicon or a silicon-on-insulator (SOI). In an implementation, the second substrate 1000 may be, e.g., a silicon substrate, or may include other materials such as silicon germanium, indium antimonide, lead telluride compound, indium arsenide, indium phosphide, gallium arsenide, or gallium antimonide. In an implementation, the second substrate 1000 may be a base substrate having the epitaxial film formed thereon.

The second substrate 1000 may include an active region 1100 and an element isolation film 1200. The active region 1100 may be defined by the element isolation film 1200. For example, a plurality of active regions 1100 may be isolated into separate regions by the element isolation film 1200.

The element isolation film 1200 may include at least one of silicon oxide, silicon nitride, and silicon oxynitride as an insulating film.

The first buried trench BT1 and the second buried trench BT2 may be formed within the active region 1100. The first buried trench BT1 and the second buried trench BT2 may be portions where the word lines, i.e., the gate electrodes are formed in a later process. For example, they may be portions where a buried cell array transistor (BCAT) is formed.

Figure 14:
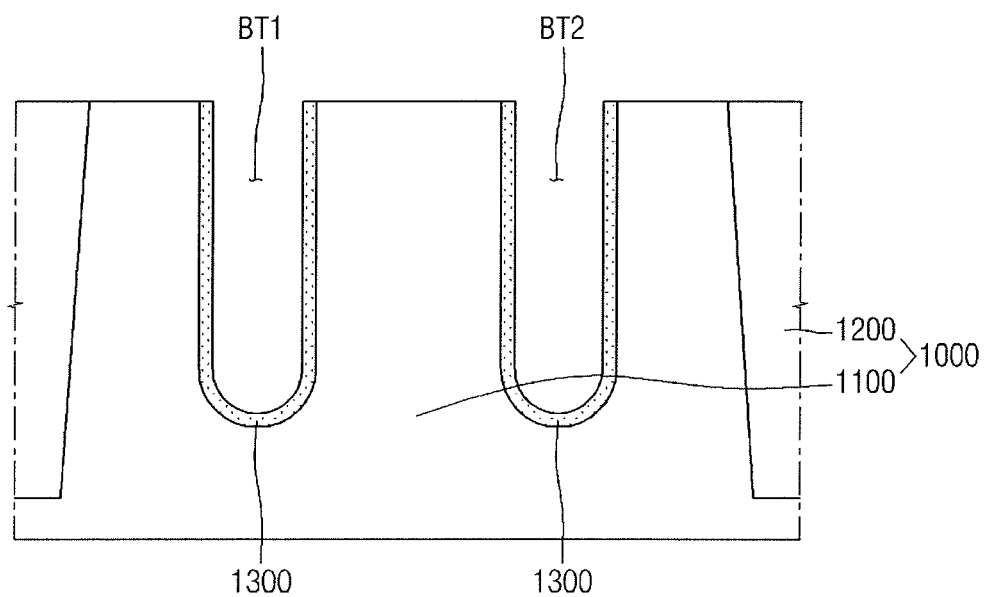

Next, referring to FIG. 14, a buried oxide film 1300 may be formed.

The buried oxide film 1300 may be formed along inner walls of the first buried trench BT1 and the second buried trench BT2. In an implementation, the buried oxide film 1300 may be formed also on an upper surface of the second substrate 1000 and an upper surface of the element isolation film 1200, and removed by a subsequent etch process. For example, the buried oxide film 1300 may be only positioned along inner walls of the first buried trench BT1 and the second buried trench BT2.

The buried oxide film 1300 may include an aluminum oxide film. For example, the oxide film 160 may be the AlO film. The buried oxide film 1300 may be very thin, and the first buried trench BT1 and the second buried trench BT2 are partially filled, leaving an empty space.

In an implementation, another gate insulating structure may be formed along the inner walls of the first buried trench BT1 and the second buried trench BT2 before formation of the buried oxide film 1300.

Figure 15:
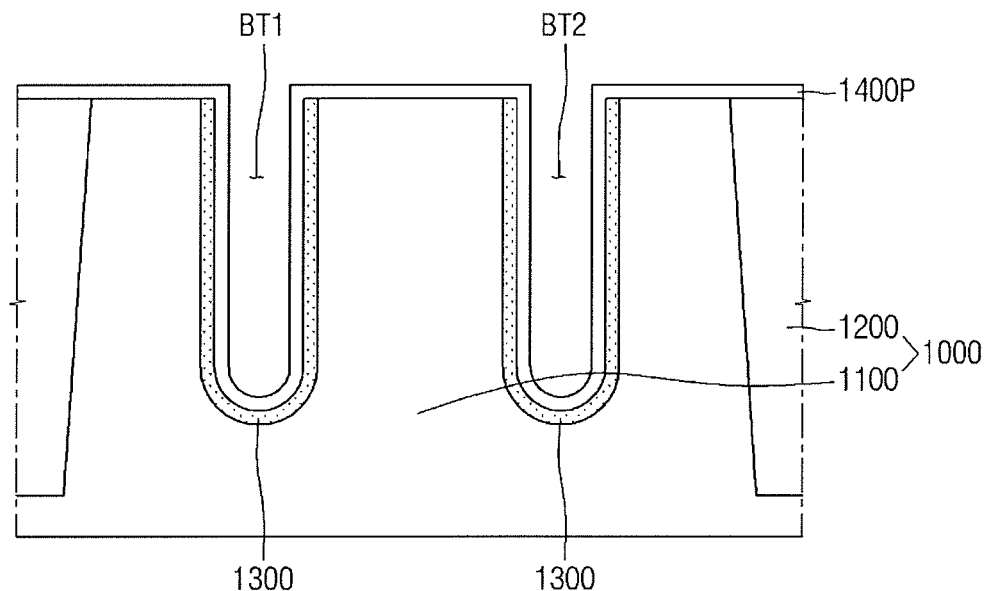

Next, referring to FIG. 15, a buried continuous film 1400P may be formed.

The buried continuous film 1400P may be formed along an upper surface of the buried oxide film 1300. The buried continuous film 1400P may be formed continuously along an upper surface of the buried oxide film 1300. The expression "continuously" used herein may include both a meaning opposite the expression "discontinuously" that represents it when a portion is cut in the middle, and so on, and a meaning indicating that a thickness is regular in a direction of extension. For example, the buried continuous film 1400P may seamlessly overlie an upper surface of the buried oxide film 1300 and may have a regular or uniform thickness.

In an implementation, the buried continuous film 1400P may be formed not only along upper surfaces the first buried trench BT1 and the second buried trench BT2, but also along an upper surface of the second substrate 1000 and an upper surface of the element isolation film 1200.

In an implementation, the buried continuous film 1400P may have a very thin thickness. The buried continuous film 1400P may have a thickness of, e.g., 0 angstrom to 20 angstroms. In an implementation, the thickness of the buried continuous film 1400P may be greater than 0 angstrom. A thickness of the buried continuous film 1400P may serve as a factor in determining a thickness of a buried conductive film 1450P of FIG. 16 which will be transformed from the buried continuous film 1400P in a subsequent process.

The buried continuous film 1400P may include TiON. In an implementation, a ratio of O, i.e., oxygen, may be greater than a ratio of N, i.e., nitrogen. Based on a total weight of O combined with N as 100, the ratio of N may be 0 to 40. In an implementation, the ratio of N may possibly be 0, and this may indicate TiO, instead of TiON.

Figure 16:
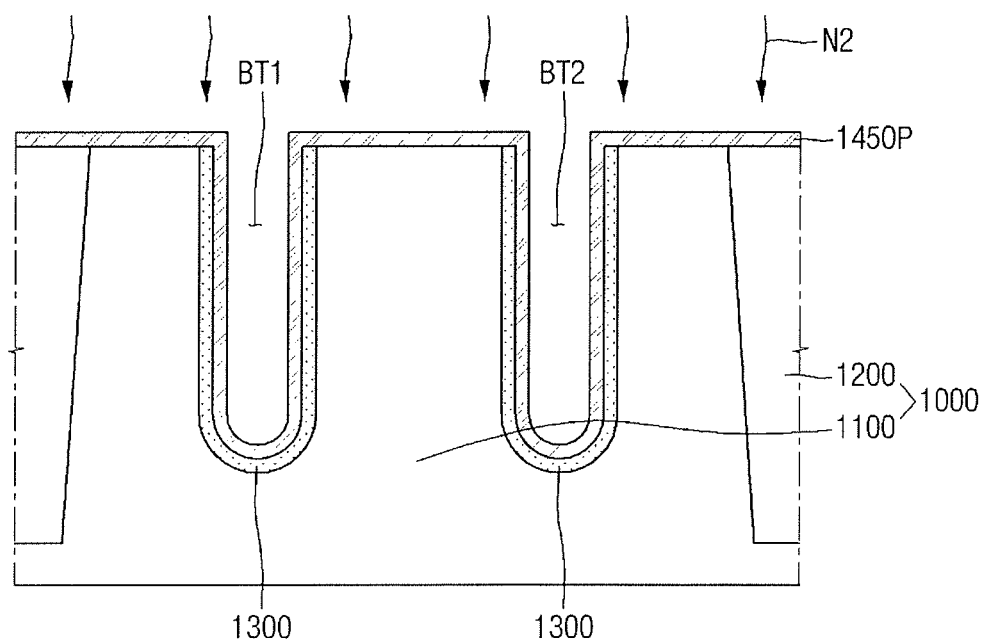

Next, referring to FIG. 16, the buried conductive film 1450P may be formed.

The buried conductive film 1450P may be formed by performing a second nitriding process N2 on the buried continuous film 1400P. For example, adding the buried continuous film 1400P with a nitrogen component may result in transformation into the buried conductive film 1450P. Accordingly, a thickness of the buried conductive film 1450P may depend on a thickness of the buried continuous film 1400P. For example, when a thickness of the buried conductive film 1450P is equal to a thickness of the buried continuous film 1400P or modified from a thickness of the existing buried continuous film 1400P, the thickness may be minutely added or reduced based on the above thickness.

The second nitriding process N2 may include at least one of various processes for adding nitrogen. In an implementation, the second nitriding process N2 may include, e.g., at least one of the $NH_3$ annealing, the $N_2$ plasma process and the RTN process.

As a result, the buried conductive film 1450P may include TiN. In an implementation, the previous TiON or TiO film may become TiN film, and some oxygen may remain. For example, based on a total weight of the oxygen (O) combined with the nitrogen (N) as 100 in the buried conductive film 1450P, a ratio of N may be 40 to 100. For example, when a ratio of N is 100, this may mean that the TiN film may not include oxygen.

Some methods may deposit TiN itself and may not use a two-stage method for nitriding TiO or TiON. Because a decreased thickness of a material film to be deposited may be desirable, e.g., with a miniaturization and integration of the semiconductor device, a failure to deposit a material film that is 20 angstrom or less could occur if TiN were to be directly deposited.

For example, if TiN were to be directly deposited, a discontinuous film instead of a continuous film could be formed. For example, the TiN film may be formed with spaced apart portions in a shape of an island on an upper surface of the buried oxide film 1300. Such a discontinuous TiN film may not completely overlie the buried oxide film 1300 and may not have a regular thickness, which could then generate or cause several problems in a later process.

In an implementation, in order to form a final, continuous and regular TiN film, the method for fabricating the semiconductor device according to some exemplary embodiments may form TiO or TiON film and then may perform a nitridation to thus form a final, thin and continuous TiN or TiON film.

Figure 17:
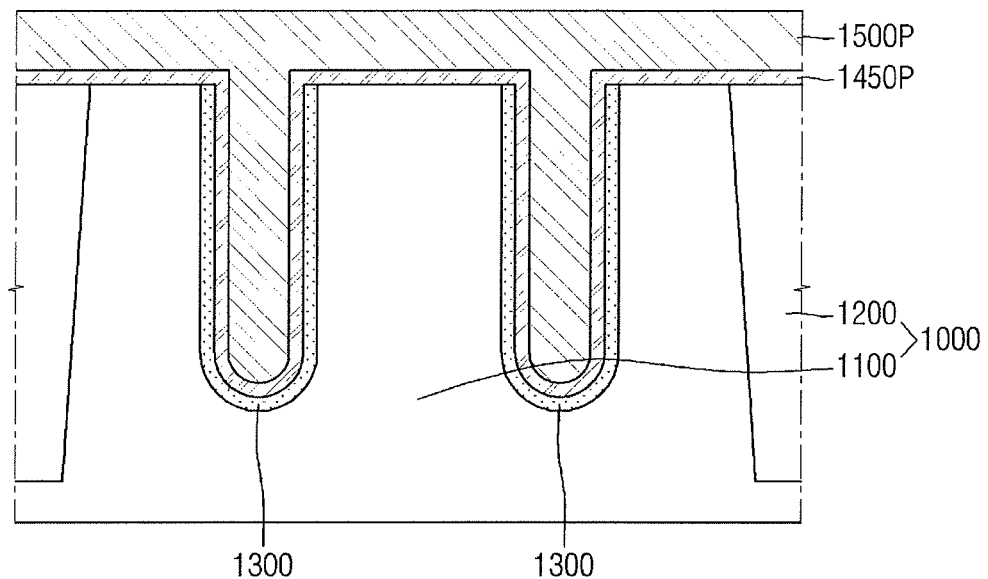

Next, referring to FIG. 17, a first buried metal film 1500P may be formed.

The first buried metal film 1500P may completely fill the first buried trench BT1 and the second buried trench BT2 on the buried conductive film 1450P. In an implementation, the first buried metal film 1500P may overlie an upper surface of the buried conductive film 1450P formed beyond the first buried trench BT1 and the second buried trench BT2. For example, the first buried metal film 1500P may also be formed on upper portions of the active region 1100 and the element isolation film 1200. The first buried metal film 1500P in conjunction with the buried conductive film 1450P may serve as the word line or the gate electrode.

The first buried metal film 1500P may include, e.g., tungsten W. For example, the first buried metal film 1500P may be formed by depositing tungsten. Forming the layer may use $WF_6$ as a precursor. In an implementation, a fluorine component may partially remain inside the first buried metal film 1500P.

When the buried continuous film 1400P or the buried conductive film 1450P is formed to be relatively thicker and/or irregular, horizontal widths of the first buried trench BT1 and the second buried trench BT2 may be reduced as much as the thickness. In such case, the buried metal film 190 may not be formed regularly according to step coverage.

If the first buried metal film 1500P were to not grow regularly, surfaces of the buried metal film 190 growing from both sidewalls of the first buried trench BT1 and the second buried trench BT2 may not be met naturally, thus forming a slit in a vertical direction therein.

Such a slit may become a space where the two surfaces exceed a junction surface where the two surfaces meet, thus preventing contact of the two surfaces. If the slit were to be formed with a certain volume or larger, fluorine, which may remain within the first buried metal film 1500P after being used in the precursor of the first buried metal film 1500P, could be left in the slit in the form of $F_2$.

In such a case, hydrogen in gas form, which may be included in the other elements such as the buried oxide film 1300 may meet the $F_2$, thus forming HF. The HF thus formed may damage the semiconductor device by melting the buried oxide film 1300.

The method for fabricating the semiconductor device according to some exemplary embodiments may help reduce or prevent the damage of the semiconductor device described above by forming a very thin buried conductive film 1450P which is continuous and regular.

Figure 18:
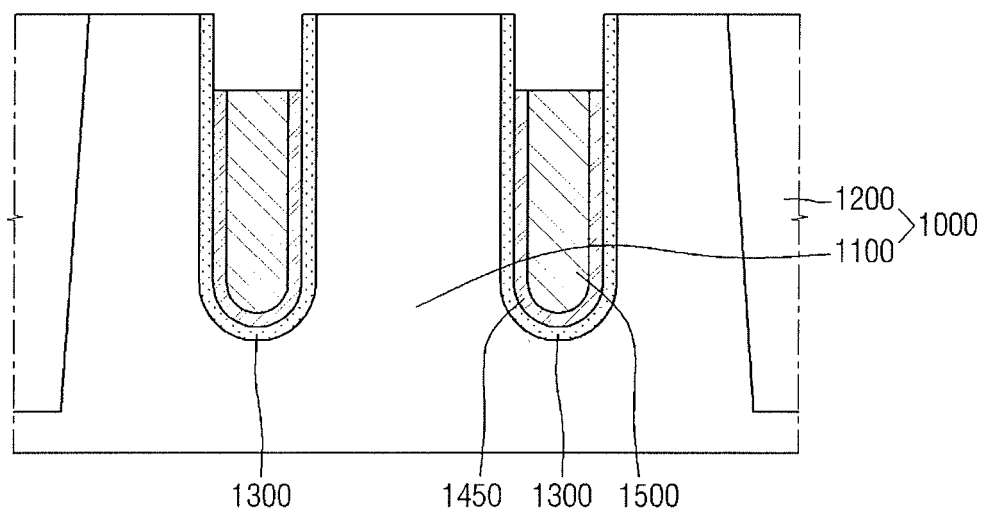

Next, referring to FIG. 18, portions of the first buried metal film 1500P and the buried conductive film 1450P may be removed.

The first buried metal film 1500P and the buried conductive film 1450P may be removed so that they are not present on the second substrate 1000 and the element isolation film 1200. In an implementation, the first buried metal film 1500P and the buried conductive film 1450P may be removed to fill only portions of the first buried trench BT1 and the second buried trench BT2. Accordingly, the first buried metal film 1500P may be device-isolated into a second buried metal film 1500 and the buried conductive film 1450P may be patterned with the buried conductive pattern 1450.

In an implementation, a process for removing the first buried metal film 1500P and the buried conductive film 1450P may be the etch-back process.

Figure 19:
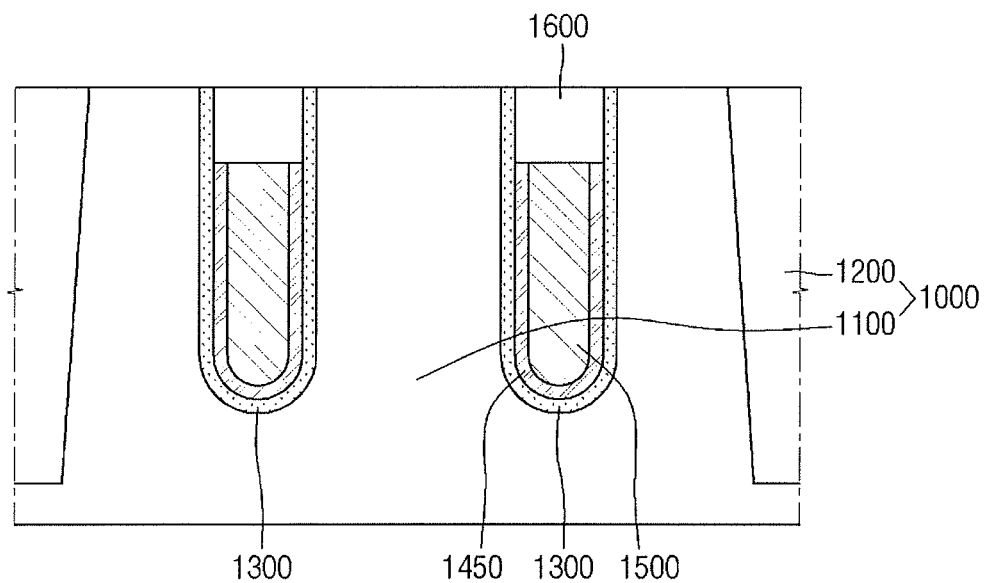

Next, referring to FIG. 19, a capping film 1600 may be formed.

The capping film 1600 may completely fill the first buried trench BT1 and the second buried trench BT2. The capping film 1600 may be formed on the second buried metal film 1500 and the buried conductive pattern 1450 which are device-isolated. A side surface of the capping film 1600 may be in contact with the buried oxide film 1300.

In an implementation, the capping film 1600 may be, e.g., an oxide film, a nitride film, an oxynitride film, or the like.

An upper surface of the capping film 1600 may be flush with upper surfaces of the element isolation film 1200 and the second substrate 1000. Further, an upper surface of the capping film 1600 may also be flush with an upper surface of the buried oxide film 1300 exposed outside the first buried trench BT1 and the second buried trench BT2.

This may be a result of performing planarization through a chemical mechanical polish (CMP).

Figure 20:
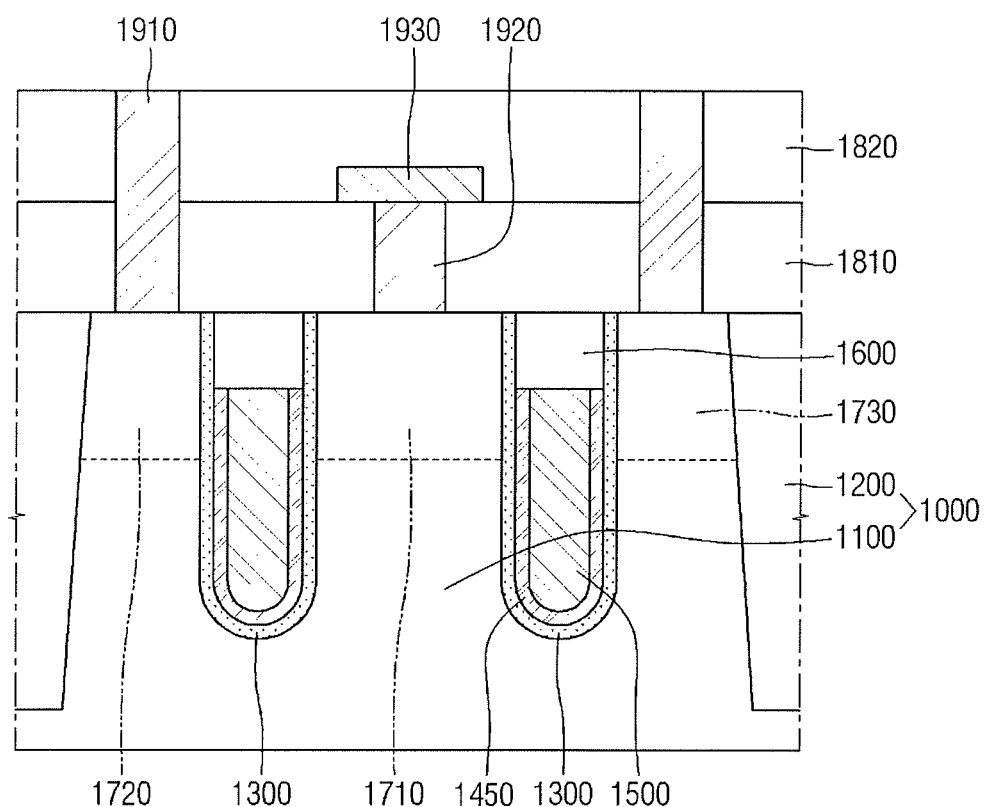

Next, referring to FIG. 20, a first source/drain region 1710, a second source/drain region 1720 and a third source/drain region 1730 may be formed.

When the implemented semiconductor device is an N-type transistor, the first source/drain region 1710, the second source/drain region 1720, and the third source/drain region 1730 may be formed by being doped with N-type impurity.

The first source/drain region 1710 may be disposed within the second substrate 1000, between the first buried trench BT1 and the second buried trench BT2. The second source/drain region 1720 and the third source/drain region 1730 may be disposed within the second substrate 1000, between the first buried trench BT1 and the element isolation film 1200 and between the second buried trench BT2 and the element isolation film 1200, respectively.

In this example, the first source/drain region 1710 may be shared by two adjacent transistors, and the second source/drain region 1720 and the third source/drain region 1730 may not be shared by two adjacent transistors.

As illustrated, the first source/drain region 1710 and the second source/drain region 1720 may partially overlap the second buried metal film 1500.

Next, a second interlayer insulating film 1810 may be formed.

The second interlayer insulating film 1810 may overlie all the upper surfaces of the element isolation film 1200, the second substrate 1000, the capping film 1600, and the buried oxide film 1300.

The second interlayer insulating film 1810 may include, e.g., at least one of silicon oxide, silicon nitride, and silicon oxynitride. The second interlayer insulating film 1810 may be single-layered or multi-layered.

Next, a bit line contact 1920 passing through the second interlayer insulating film 1810 may be formed.

The bit line contact 1920 may electrically connect a second bit line 1930 and the first source/drain region 1710 which are formed in later processes.

Next, the second bit line 1930 may be formed on the bit line contact 1920.

The second bit line 1930 in conjunction with the word line which is the second buried metal film 1500 may form an array in a shape of a lattice from a perspective of a plane. As a result, the second bit line 1930 may determine which transistor to drive.

Next, referring to FIG. 3, a third interlayer insulating film 1820 may be formed.

The third interlayer insulating film 1820 may overlie the second interlayer insulating film 1810 and the second bit line 1930. The third interlayer insulating film 1820 may include, e.g., at least one of silicon oxide, silicon nitride and silicon oxynitride. The second interlayer insulating film 1810 may be single-layered or multi-layered.

Next, a storage node contact 1910 may be formed.

The storage node contact 1910 may be formed, while passing through the second interlayer insulating film 1810 and the third interlayer insulating film 1820. The storage node contact 1910 may be formed on the second source/drain region 1720 and the third source/drain region 1730, respectively.

The storage node contact 1910 may be electrically connected with the second source/drain region 1720 and the third source/drain region 1730, respectively. In an implementation, the storage node contact 1910 may electrically connect a storage node storing charges with the second source/drain region 1720 and the third source/drain region 1730, respectively.

In an implementation, the semiconductor device formed in the above described processes may be the volatile memory device, e.g., a dynamic random access memory (DRAM).

The method for fabricating the semiconductor device according to some exemplary embodiments may help prevent the buried oxide film 1300 from melting down through a regular and thin deposition of the buried conductive film 1450P in the volatile memory device, as described above. As a result, the method may provide a semiconductor device having high integration, and also high stability and regularity.

By way of summation and review, for implementation of miniaturized integration of the semiconductor devices described above, very thin material films may be stably deposited; however, a good quality material film may be difficult to obtain with the related deposition method.

The embodiments may provide a method for fabricating a semiconductor device with improved operating performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
   forming a mold structure on a substrate such that the mold structure includes alternately and repeatedly stacked interlayer insulating films and sacrificial films;
   forming a channel hole passing through the mold structure;
   forming a vertical channel structure within the channel hole;
   exposing a surface of the interlayer insulating films by removing the sacrificial films;
   forming an aluminum oxide film along a surface of the interlayer insulating films;
   forming a TiON continuous film on the aluminum oxide film; and
   nitriding the TiON continuous film to form a TiN film.

2. The method as claimed in claim 1, wherein a thickness of the TiON continuous film is greater than 0 angstroms to 20 angstroms.

3. The method as claimed in claim 1, wherein the vertical channel structure includes:
   a channel layer formed into a shape of a cup within the channel hole;
   a core layer filling an interior of the channel layer; and
   an insulating film surrounding an exterior of the channel layer.

4. The method as claimed in claim 3, wherein the insulating film of the vertical channel structure includes:
   a tunnel insulating layer formed on the channel layer;
   a charge trap layer formed on the tunnel insulating layer; and
   a blocking insulating layer formed on the charge trap layer.

5. The method as claimed in claim 1, wherein nitriding the TiON continuous film includes $NH_3$ annealing, $N_2$ plasma, or rapid thermal processing.

6. The method as claimed in claim 1, further comprising forming a metal film on the TiN film.

7. The method as claimed in claim 6, wherein the metal film includes tungsten.

8. The method as claimed in claim 7, wherein forming the metal film includes using $WF_6$ as a precursor.

9. The method as claimed in claim 1, wherein a concentration of N in the TiON continuous film is less than a concentration of O in the TiON continuous film.

* * * * *